United States Patent
Rydbeck et al.

[11] 4,047,151
[45] Sept. 6, 1977

[54] ADAPTIVE ERROR CORRECTING TRANSMISSION SYSTEM

[76] Inventors: Nils R. C. Rydbeck, Vildanden J101; Carl-Erik Wilhelm Sundberg, Vildanden C506, both of 22234 Lund, Sweden

[21] Appl. No.: 644,804

[22] Filed: Dec. 29, 1975

Related U.S. Application Data

[63] Continuation-in-part of Ser. No. 536,182, Dec. 24, 1974, abandoned.

[51] Int. Cl.² ............................................. G06F 11/12
[52] U.S. Cl. ........................... 340/146.1 AX; 325/41
[58] Field of Search ............ 340/146.1 A X, 146.1 R; 325/41, 42, 56, 65

[56] References Cited

U.S. PATENT DOCUMENTS

| | | | |
|---|---|---|---|
| 3,078,443 | 2/1963 | Rose | 340/146.1 A X |
| 3,349,371 | 10/1967 | Brothman et al. | 340/146.1 A X |
| 3,359,543 | 12/1967 | Corr et al. | 340/146.1 A X |
| 3,496,549 | 2/1970 | Tong | 340/146.1 A X |
| 3,506,961 | 4/1970 | Abramson et al. | 340/146.1 A X |
| 3,657,700 | 4/1972 | Lutzker | 340/146.1 A X |
| 3,829,777 | 8/1974 | Muratani et al. | 325/41 |
| 3,896,416 | 7/1975 | Barrett et al. | 340/146.1 A X |

*Primary Examiner*—Charles E. Atkinson
*Attorney, Agent, or Firm*—Birch, Stewart, Kolasch & Birch

[57] ABSTRACT

A method for effecting error protecting coding in digitally modulated analog information as a function of the quality of transmission characteristics in the communication channel is provided in which the error code is embodied in the source code word, such as by reducing the number of significant bits and substituting error protecting code bits. This results in the maintenance of transmission capacity while providing the space needed for the redundant signals required to preclude error.

10 Claims, 14 Drawing Figures

ADAPTIVE ERROR CORRECTING TRANSMISSION SYSTEM

This is a continuation in part of our previous U.S. patent application Ser. No. 536,182 filed Dec. 24, 1974 now abandoned.

BACKGROUND OF THE INVENTION

This invention relates to a system for transmitting analog information by digital modulation methods via a communication channel, the transmission properties of which can vary in the time. The invention more particularly relates to a system of adjusting the digital coding of the analog information to the varying transmission properties.

Most of the digital communication systems use transmission channels the transmission properties of which can vary to a greater or smaller extent in the time. Depending on the size and nature of these variations and on possible shortcomings in the systems, digital errors can arise at the transmission of the information. These digital errors, depending on the design of the systems, can cause interruption in the formation transmission or result in that the information transmitted and received do not entirely agree with the information to be transmitted.

When the total distortion of a communication system transmitting analog information is defined as the difference between the analog information prior to and after the transmission, the total distortion then depends on possible distortion from digital errors at the transmission and on quantizing distortion from the coding of the analog information to digital signals.

The quantizing distortion is determined by the nature of the analog information transmitted by the system and by the way this information is coded to digital signals. With the knowledge of certain statistic parameters of the information to be transmitted, the quantization distortion from the use of a certain digital coding can be calculated theoretically. The quantization distortion, therefore, in principle does not vary with the transmission properties of the channel being used, as long as the coding is not changed.

When the transmission properties of a transmission channel deteriorate beyond a certain limit, generally the number of digital errors at the transmission increases. This implies in general that the distortion from digital errors at the transmission increases to a higher or lower degree, depending on the design of the system.

Many proposals are known how an information communication system manually or automatically can be adjusted to variations of the transmission properties of a transmission channel. When the variations are expressed as changes in the signal-noise ratio for the digital signals, the energy of the digital signals in relation to the noise and other interferences could in principle be increased, where possible. This can in principle be brought about, for example, by increasing the effect or durability of the signals. It is, however, not always possible, for technical and/or economic reasons, to increase the signal effect, for example in certain satellite communication systems, and an increase in the durability of the signals, for example according to U.S. Pat. No. 3,700,820, often results in a reduced transmission capacity of the system at poor transmission properties. This can be a disadvantage.

A basically different method of adjusting a communication system to variations in the transmission properties of a transmission channel is to use error correcting coding of the analog information to be transmitted. The error correcting capacity of the coding can manually or automatically be adjusted to the transmission properties, for example according to U.S. Pat. No. 469,125 (Data Transmission System, invented by Alexander H. Frey Jr.). According to these proposals, the error correcting capacity of the system is adjusted automatically to the frequency of digital errors at the transmission by variation of the number of redundant digital signals. Such a variation, however, also implies that the transmission capacity of the system varies as the redundancy of the digital signals varies. Moreover, more and/or more complex coders and decoders are required.

The present invention is based on somewhat different ideas which the inventors Nils Rydbeck and Carl-Erik Sundberg have explicitly described in the following publications by Telecommunication Theory, Lund Institute of Technology, Sweden:

a. "Techniques for introducing Error Correcting Codes into TDMA Satellite Communication Systems", Technical Report TR-55.

b. "Pulse Code Modulation with Error Correcting Codes for TDMA Satellite Communication Systems", Technical Report TR-57.

c. "Further investigations of PCM/TDMA satellite communication systems with error correcting codes", Techincal Report TR-64.

d. "PCM/TDMA Systems with Error Detecting Codes", Technical Report TR-70.

SUMMARY OF THE INVENTION

The present invention is based on the idea of using error protecting, i.e. error detecting and/or error correcting coding only when necessary, and that the information transmission speed, at least at moderate deteriorations of the transmission properties of the transmission channel, need not be reduced at the change-over to error correcting coding.

By permitting a limited increase of the quantization distortion at the change-over to error protecting coding, it is possible according to the invention to provide space for redundant digital signals on the transmission channel without reducing the transmission capacity.

When the change-over to error protecting coding is initiated when the distortion from digital errors at the change-over dominates over the quantization distortion, a reduction of the total distortion can be obtained thereby, so that the distortion from digital errors decreases more than the quantization distortion increases. The basic idea behind the present invention, therefore, in a somewhat simplified manner, can be described by stating that the ratio between the quantization distortion and the distortion from digital errors is adjusted to the transmission properties of the transmission channel.

According to a preferred embodiment of the invention, the same coder is always used for quantizing and coding the analog information to digital symbols. When the transmission properties of the transmission channel deteriorate, one or more of the least significant digital signals are exchanged against redundant digital symbols according to an error detecting and/or error correcting code.

Certain embodiments of the invention are based on the condition that the error protecting i.e. error detecting and/or error correcting code used at poor transmission conditions is adapted to detect and/or correct errors only or substantially in the most significant digital symbols.

One embodiment, which is especially designed for and adjusted to TDMA-systems, is based on the condition that each ground-station in principle can receive also those parts of a burst which are not destined to the ground-station in question. This condition is utilized in this embodiment for transmitting certain of the digital symbols in an error detecting and/or error correcting code, used in a channel with poor transmission properties via parts in the burst not associated with this channel. These symbols in the burst preferably are transmitted instead of the least significant symbols corresponding to information to be transmitted via one or more other channels. The inventive idea behind this embodiment can, somewhat simplified, be expressed as the available effect or transmission capacity in the burst is redistributed from one or more channels with better transmission properties to a channel with poorer transmission properties. The transmission capacity of the TDMA-system is not changed by this pure redistribution.

SHORT DESCRIPTION OF THE DRAWINGS

DETAILED DESCRIPTION OF DRAWINGS AND EMBODIMENTS

Figure 1:
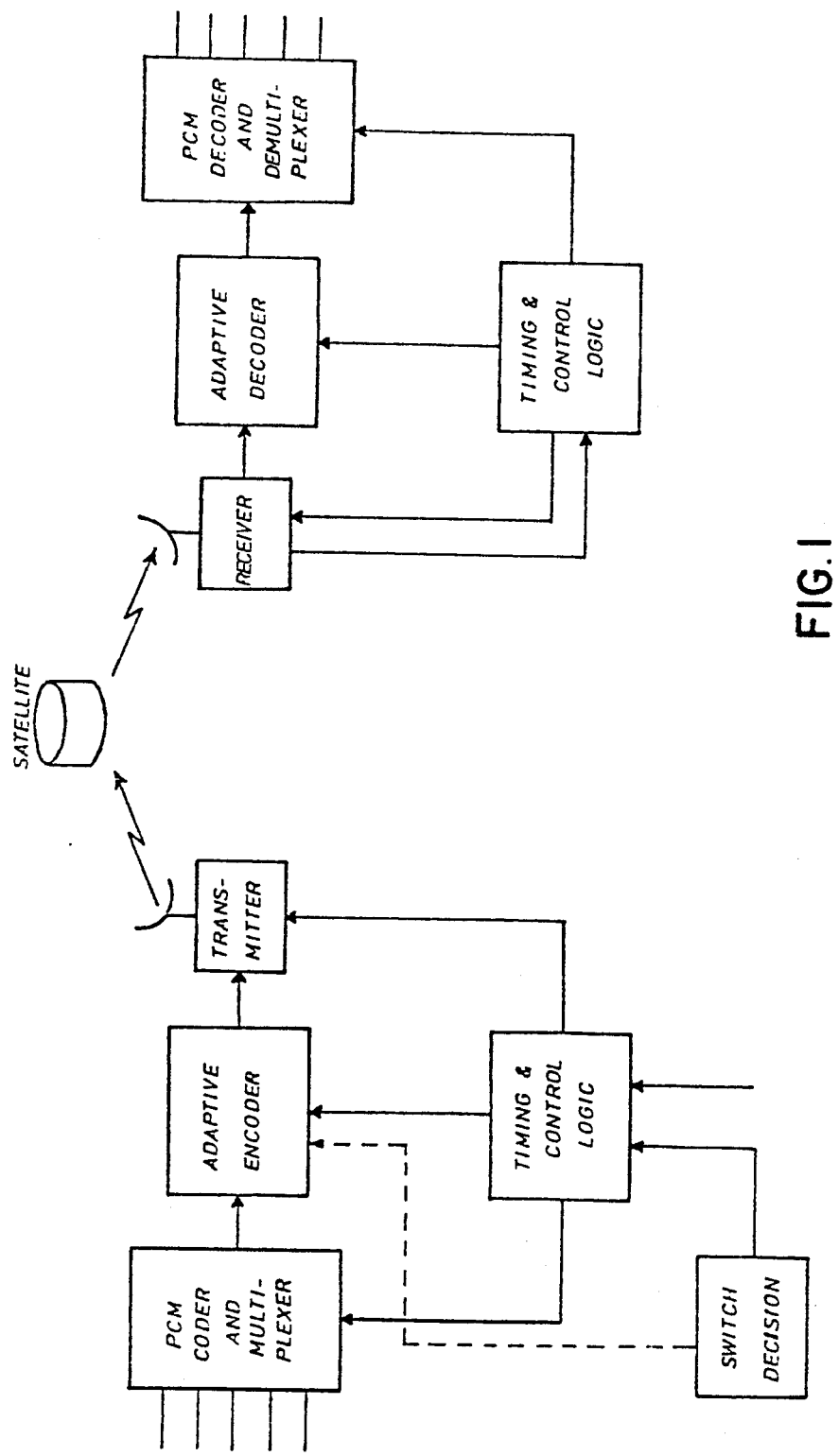
FIG. 1 is a simplified block diagram for a TDMA-satellite communication system.

FIG. 1 shows a simplified block diagram for a TDMA communication system where telephone conversations can be transmitted from a first group of subscribers via a transmitter, a communication satellite and a receiver to a second group of subscribers. For mutual information exchange such as telephone conversation, of course, a two-directional communication is required, and in proposed TDMA-systems each ground-station has both transmitting and receiving equipment. The basic idea of a TDMA-system, of course, also includes the possibility of having more than two ground-stations. For reason of simplicity, however, FIG. 1 shows only the transmitting part of one ground-station and the receiving part of another ground-station.

The TDMA-system indicated in FIG. 1 is for the most part of a conventional type and, therefore, its operation should not have to be described in detail. The subscribers farthest to the left in the Figure are connected to a PCM coder and multiplexor, which in a time division multiplex manner samples ingoing analog signals and quantizes and codes the same to digital PCM words, which e.g. can consist of 8 binary digital symbols.

The digital information from the PCM coder and multiplexor is fed to an adaptive encoder, also to which signals containing information on current transmission properties in the system are fed either directly from a switch decision means or via timing and control logic. The switch decision means in its turn receives for producing these signals information on the transmission properties in a manner which is of minor importance for the present invention and, therefore, is not shown. The frequency, for example, of digital errors and/or the signal-noise ratio for digital signals can be measured or estimated in a known manner on the receiver side and be forwarded via some return channel in the system to the switch decision means. As the weather conditions are of great importance at satellite communication systems, it is in principle also possible to apply a manual information feed to the switch decision means in response to meteorologic information from the ground-stations. Also other information related to the transmission properties which is fed in any per se arbitrary way to the switch decision means can in principle be imagined. See column 9, lines 49–59 in the U.S. Pat. No. 3,078,443. The phrase "producing at least one signal containing information on the transmission properties of the channel" is hereinafter to be understood so that one or more of these and/or other known methods are applied in order to produce on the transmitting side of the system at least one signal, which contains information on the variable transmission properties of a transmission channel in question. As Transmission channels, of course, in the TDMA-case are to be understood as the relevant parts of the transmitter, satellite and receiver and the medium therebetween in which the electromagnetic waves are propagated.

Adaptive encoders can in response to the signals from the switch decision means either forward the digital information from the PCM coder and multiplexor substantially unchanged to the transmitter or process the digital information by error protecting, i. e. error detecting and/or error correcting coding before it is forwarded to the transmitter. The transmitter sends digital information supplied from the adaptive encoder and synchronisation signals to the satellite. The timing and control logic controls the described parts on the transmitter side and synchronizes them both with each other and with corresponding means at other ground-stations. For synchronization with the receiver side and with other ground stations, the timing and control logic receives control signals in a way not shown. These control signals, for example, can be received via a return channel from the receiver side and/or via channels from other ground-stations now shown. The way that these control signals are produced and transmitted to the timing and control logic does not constitute a part of the present invention, but is assumed to take place in a previously known manner.

The receiver receives from the satellite the digital information and synchronization signals sent by the transmitter. Depending on the transmission conditions, such as weather etc., the received digital information and synchronization signals etc. can deviate to a greater or smaller degree from what has been sent by the transmitter.

The receiver feeds the synchronisation signals to the timing and control logic on the receiver side and feeds the digital information to the adaptive decoder. The adaptive decoder, in response to signals from the timing and control logic on transmission properties of the transmission channel and/or on the mode of operation of the adaptive encoder, can either forward supplied digital information substantially unchanged to the PCM decoder and demultiplexor or forward digital information received by error detecting and/or error correcting decoding of supplied digital information.

The PCM decoder and demultiplexor decode the digital information received from the adaptive decoder and forward the information to the subscribers on the receiver side under control of the timing and control logic. The timing and control logic also controls the remaining means on the receiver side and synchronizes them both with each other and with corresponding means on the transmitter side. For this purpose the timing and control logic receives synchronization signals from the receiver.

The parts of the summarily described TDMA-system according to FIG. 1 which are concerned by the present invention are in principle only the adaptive encoder and the adaptive decoder and to a certain extent their co-operation with the remaining means. A great number of embodiments of adaptive encoders and adaptive decoders different in principle and/or structural design are possible within the scope of the invention. One way of describing different possible embodiments is to describe the error protecting, i.e. error detecting and/or error correcting coding. It is in principle fully possible to use both convolutional codes and block codes, but for reason of simplicity only block codes are described hereinafter.

Figure 2:
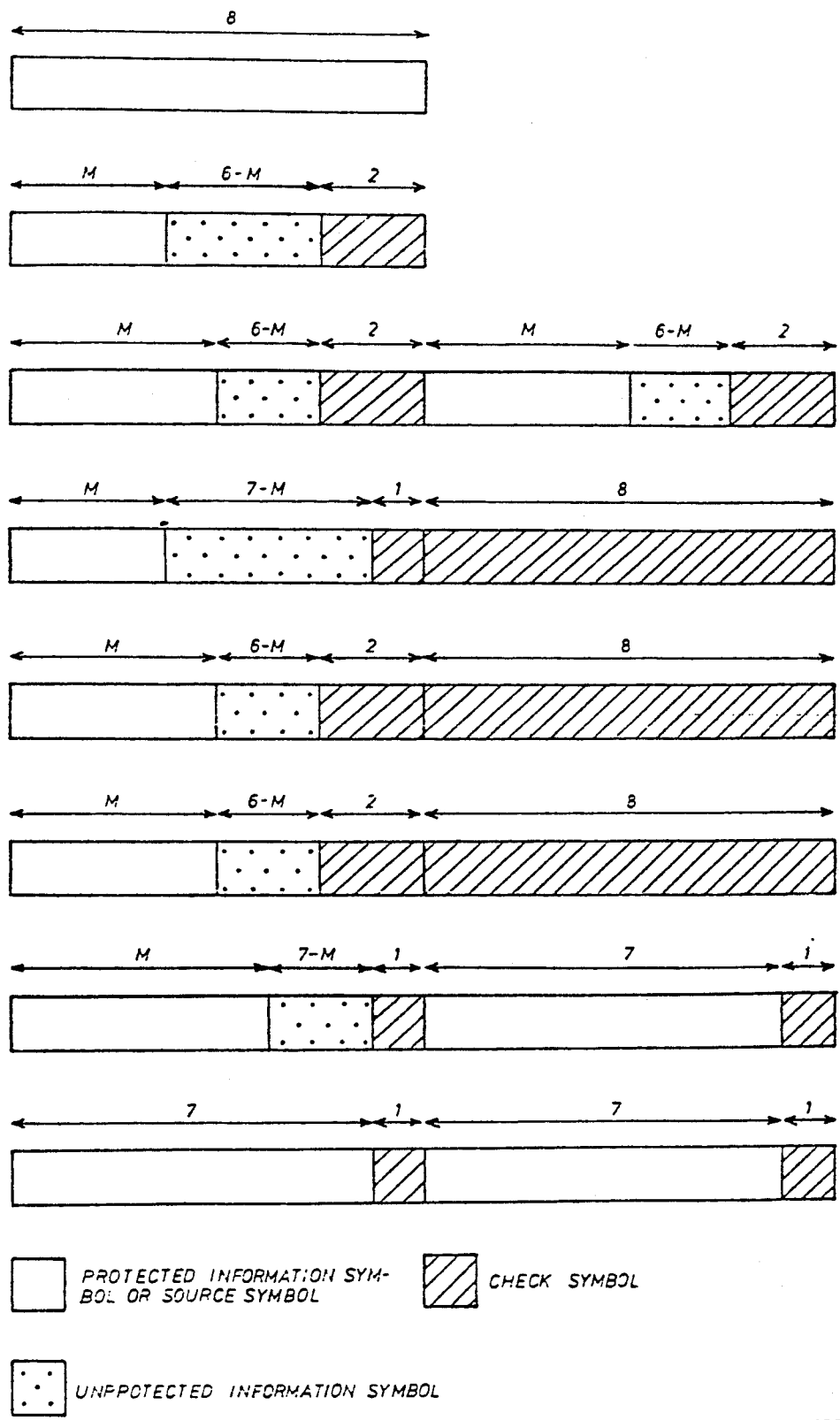
FIG. 2 shows word-formats and ingoing digital symbols at possible embodiments of a TDMA-system according to FIG. 1.

FIG. 2 shows examples of imaginable word formats for the system according to FIG. 1 and the distribution of different types of digital symbols. Uppermost in FIG. 2 a source word is shown, i.e. a word from an information source. In the case concerned in FIG. 1 the source word is a PCM-word with 8 binary digital information symbols. According to the invention, an encoding of these digital information symbols takes place in the adaptive encoder according to an error detecting or error correcting code only when the transmission properties of the transmission channel are such that the transcoding is deemed necessary. Under the source word in FIG. 2 a number of examples of different code word formats for error detecting and/or error correcting codes are shown which represent different embodiments of the invention. They all have in common that they have a certain redundancy, which intentionally is introduced by the adaptive encoder upon the encoding from the source words to the code words.

Figure 3:
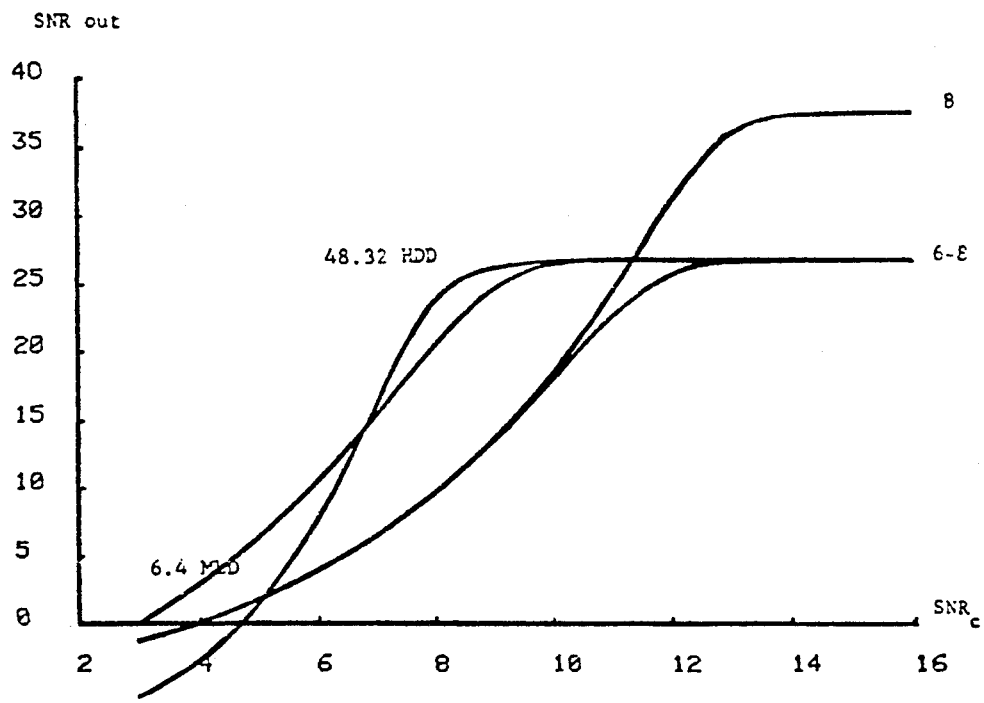
FIGS. 3–5 show curves for calculated signal-to-noise ratios theoretically obtainable with different embodiments of the invention.
Figure 6:
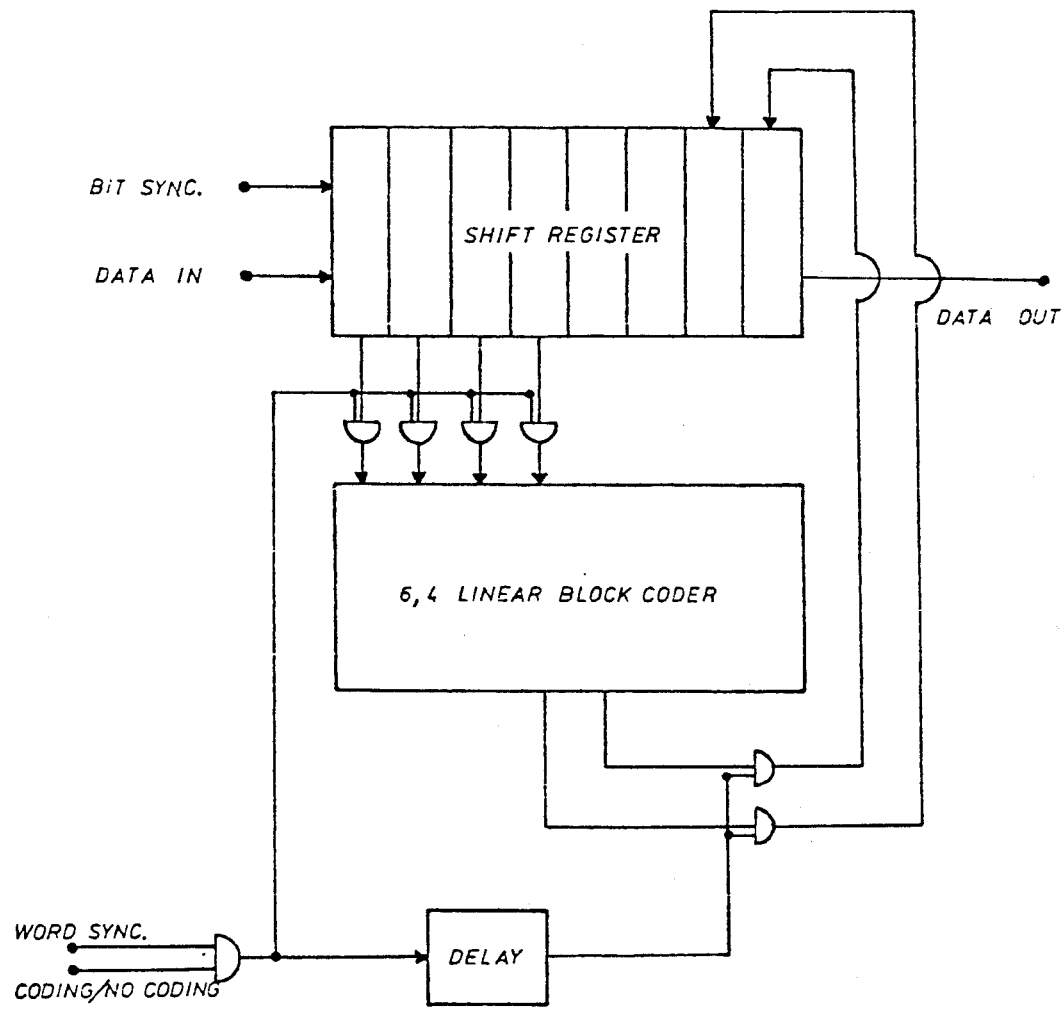
FIGS. 6 and 7 show the structure of adaptive encoders and adaptive decoders in FIG. 1 according to one embodiment of the invention.
Figure 7:
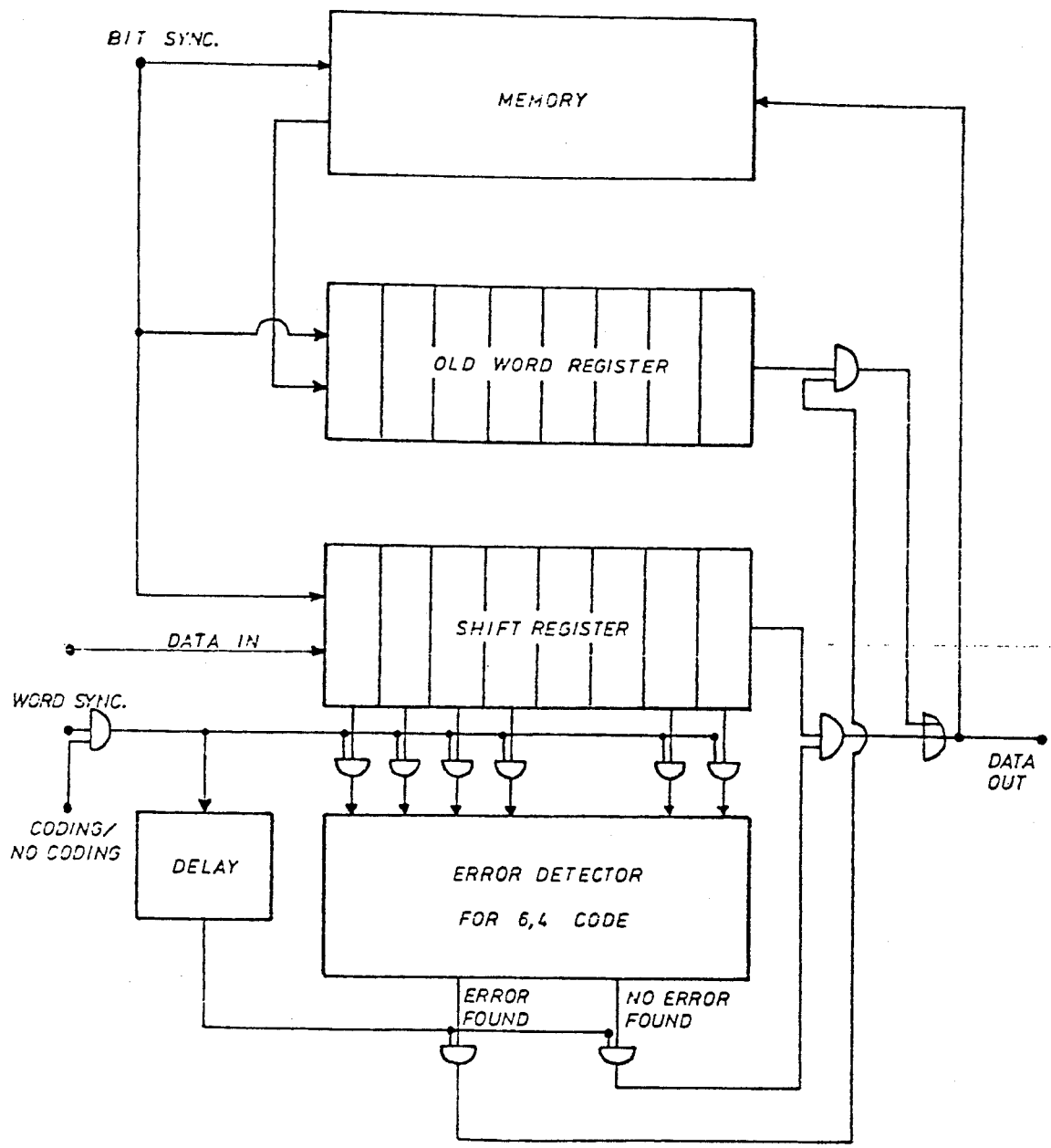

The uppermost code word format shows the general distribution of different types of symbols for an embodiment of the invention called 6–8 PCM with M coded symbols per sample and coding over only 1 sample. This implies that 8 digital symbols are used for each sample, but that the information content corresponds only to 6 symbols. The redundancy introduced through the digital encoding in the adaptive decoder, thus, is only 2 symbols. For reason of simplicity, in FIG. 2 only 6 pure information symbols are shown which are followed by 2 pure control symbols. More sophisticated distributions of the redundancy are, of course, possible. Furthermore, only the M most significant information symbols are protected by the error detecting and/or error correcting code. The 6-M least significant information symbols certainly are comprised in the code word format, but in reality they are not protected against errors. See "Feasibility study of error-code multiplexing systems" by J Gordon, R Barrett and N Montague of the Hatfield Polytechnic England for ESRO, ESTEC contract number 1914/73SW, June 1974. According to a preferred embodiment, a channel encoder quite simply replaces the two least significant digital symbols in the PCM-word by two digital control symbols while the remaining digital symbols in the PCM-word are not changed. FIGS. 6 and 7 show adaptive encoders and, respectively, adaptive decoders for such an embodiment with error detecting code. FIG. 3 shows a calculated signal-noise ratio for normal 6 bit PCM and 8 bit PCM and 6–8 PCM with a 6, 4 block code with maximum likelihood decoding, MLD. The 4 most significant ($M=4$) of the 6 information symbols are protected against errors by this code. When the lowest acceptable signal-noise ratio in the received information, for example, is 24 dB, one sees in FIG. 3 that 6, 4 MLD coding requires a minimum signal-noise ratio for the digital signals which is about 2, 2 dB lower than the corresponding minimum value for a normal 8 bit PCM. It is, thus, possible without reducing the information transmission speed to transmit analog information with 6–8 PCM of this type as long as the signal-noise ratio of the digital signals on the channel has not dropped more than 2, 2 dB from the lowest possible value for normal 8 bit PCM without error detecting or error correcting coding. Hereinafter, these 2, 2 dB and corresponding values for other codes and coding methods will be called coding gain.

Figure 8:
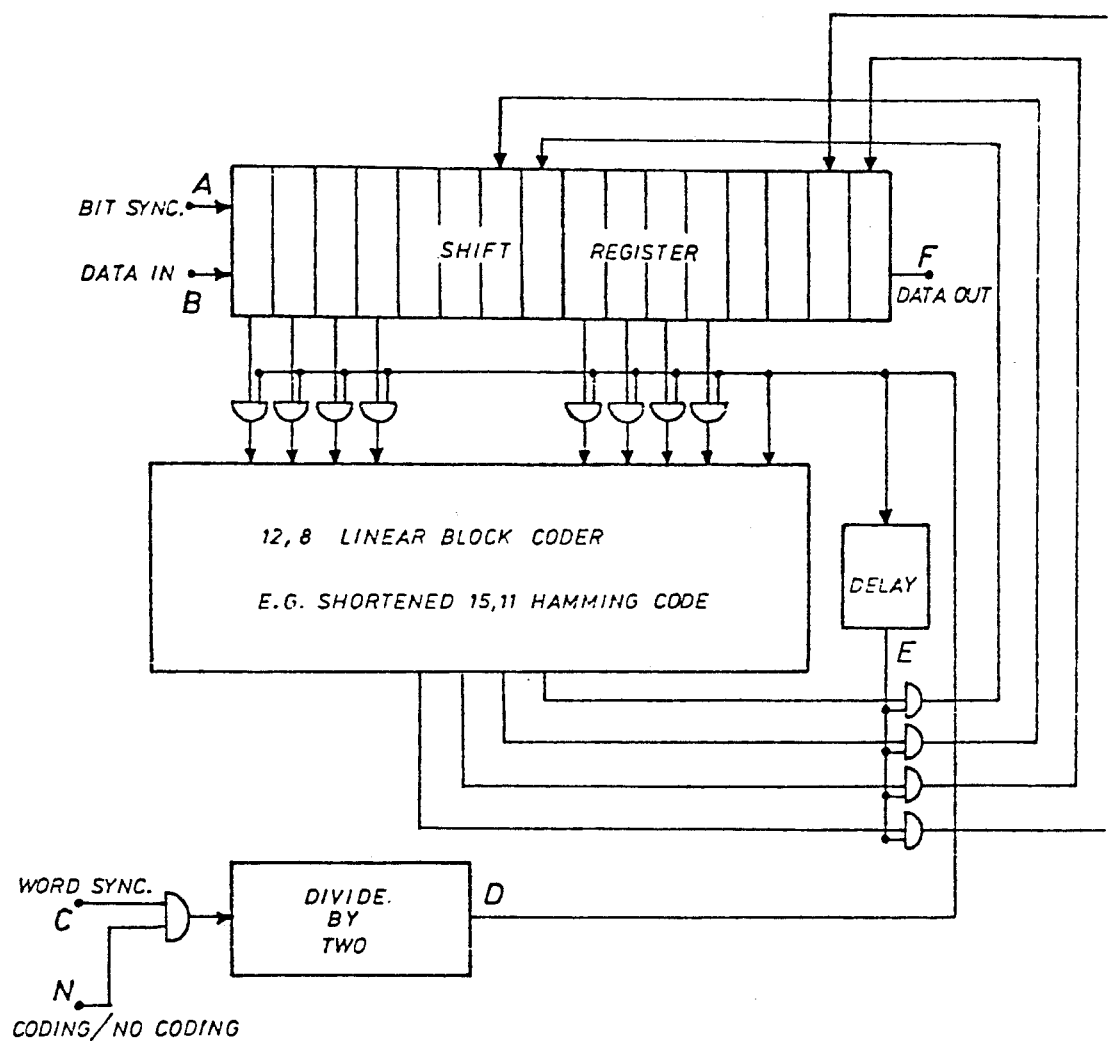
FIGS. 8 and 10 show the structure of adaptive encoders and decoders in FIG. 1 according to another embodiment of the invention.
Figure 10:
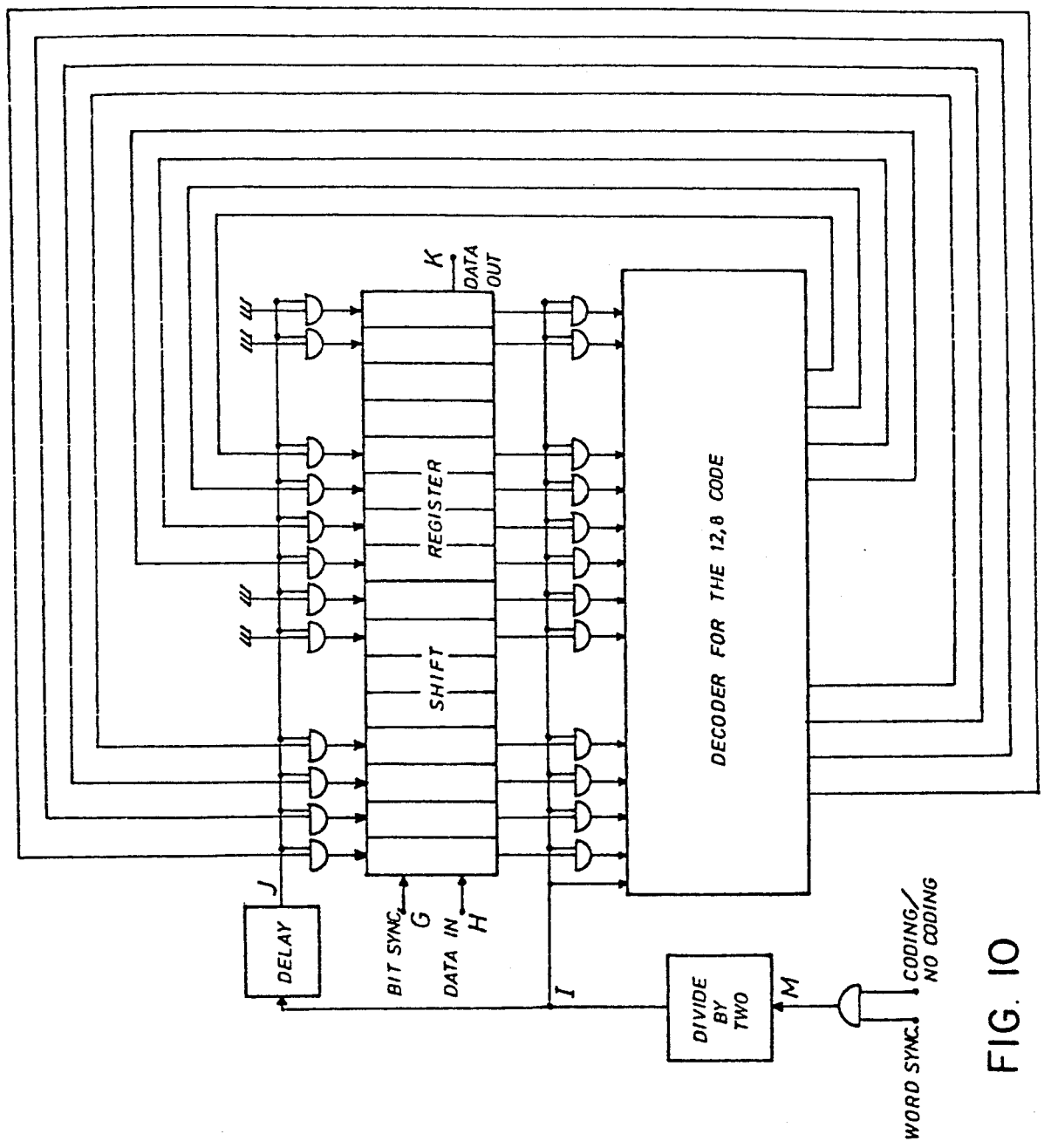

According to a preferred embodiment of the present invention, code words are formed of symbols from 2 or more source words. The third word format from the top in FIG. 2 shows an embodiment called 6–8 PCM with M coded symbols per sample and coding over 2 samples. The format includes a total of 16 digital symbols, but the information content corresponds to only 12 symbols. The redundancy introduced by processing the source words to code words in the adaptive encoder, thus, is 4 symbols. For reason of simplicity, this is embodied as 2 groups of 2 control symbols each. More sophisticated distributions of the redundancy, of course, can be imagined within the scope of the invention. Furthermore, only 2 M of the most significant information symbols are protected by an error correcting code. The 2 (6-M) least significant information symbols certainly are included in the code word format, but in reality they are not protected against errors. According to a preferred embodiment of this type of 6–8 PCM, the adaptive encoder replaces the two least significant symbols in the respective PCM-word by two digital control symbols while the remaining digital symbols in the respective PCM-word are not changed. FIGS. 8 and 10 show adaptive encoders and, respectively, adaptive decoders for such an embodiment. Although FIG. 2 shows two groups of 8 digital symbols next to each other, the scope of the invention comprise for time division multiplex systems, the use of 2 subsequent source words from one and the same connection between subscribers instead of 2 subsequent source words on the channel, which words are associated with different connections between subscribers. In FIG. 3 is shown a calculated signal-noise ratio for 6–8 PCM with 4 error protected symbols per PCM-word and coding over 8 PCM-words. This code is called 48, 32. One can see that a coding gain of about 3 dB can be obtained with hard decision decoding HDD without reducing the transmission speed for the analog signals.

Figure 4:
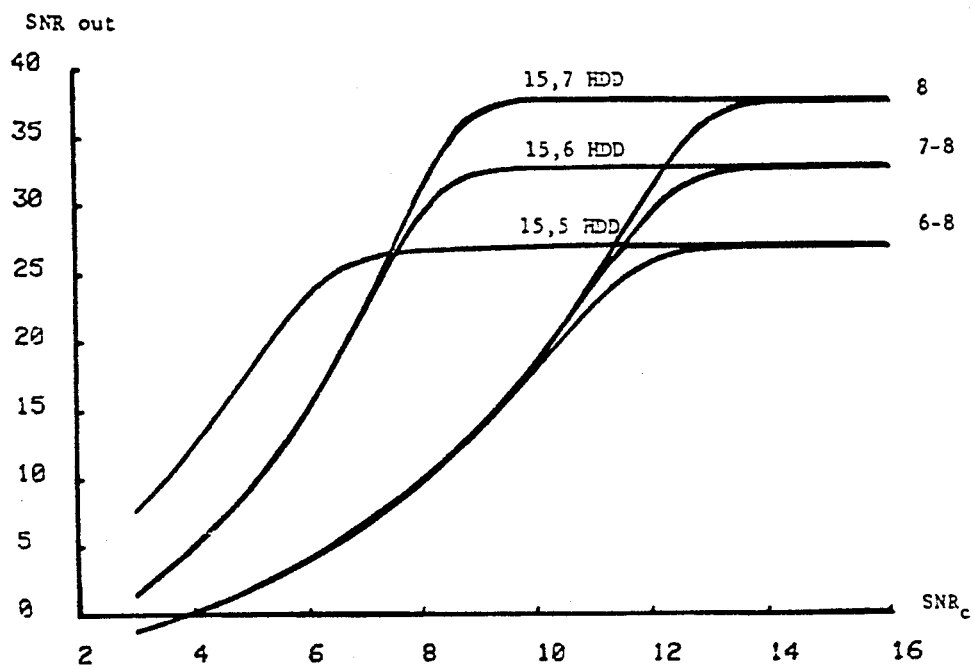

When the transmission properties of the transmission channel are deteriorated substantially so that the signal-noise ratio of the digital symbols drops substantially, the effect gains by the afore-described coding and decoding with adaptive encoder and adaptive decoder can become insufficient. According to an embodiment of the invention, called rate ½ method, the entire TDMA-system or a part thereof according to FIG. 1 is changed so that the transmission capacity to and from some or all stations drops to half the capacity. The fourth code word format from the top in FIG. 2 shows such an embodiment called 7-8 PCM rate ½ with M coded symbols and coding over only 1 sample. The total length of the format is 16 symbols, but the information content corresponds only to 7 symbols. The redundancy introduced by the adaptive encoder upon replacement of the source words by code words, therefore, is 9 symbols. FIG. 2 shows for reason of simplicity at first 7 pure information symbols and thereafter 9 redundant symbols. More sophisticated distributions of the redundancy, of course, are possible. In analogy with afore-described codes, only the M most significant digital symbols are protected by the error protecting code. According to a preferred embodiment, the adaptive encoder leaves the 7 most significant digital symbols in the source word unchanged and replaces the least significant symbol with one of the 9 control symbols. The remaining 8 control symbols are transmitted instead of an entirely different source word by the adaptive encoder to the transmitter. In FIG. 2 the code word format is shown as two adjacent groups of 8 symbols, but the scope of the invention also comprises the possibility that the two groups with respect to time are located farther away from each other, even in different bursts. Instead of 7-8 PCM rate ½, one can within the scope of the invention also imagine 6-8 PCM rate 178 . It lies, however, beyond the scope of the invention, to form, for example, a code with 8 pure information symbols and 8 control symbols at poor transmission properties of the transmission channel. Such a coding could in analogy with previous denomination be called 8 PCM rate ½. FIG. 4 shows calculated signal-noise ratios for 8 PCM rate ½ with 15, 7 code with HDD, 7-8 PCM rate ½ with 15, 6 code with HDD, and 6-8 PCM rate ½ with 15, 5 code with 6, 7 and 8 bit PCM without error detecting or error correcting coding.

Figure 5:
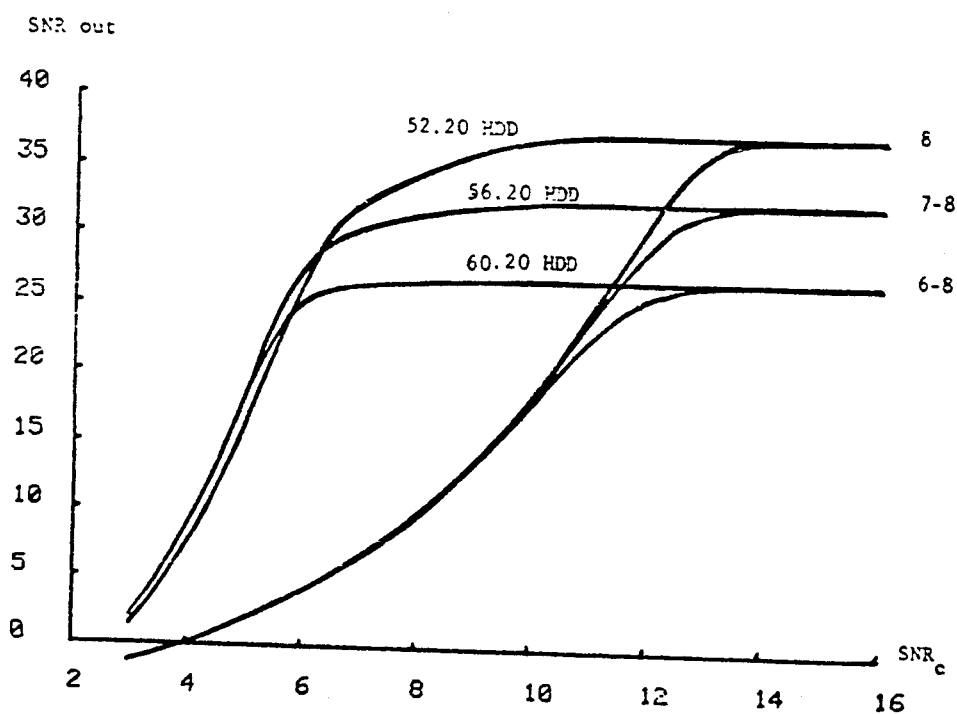
Figure 14:
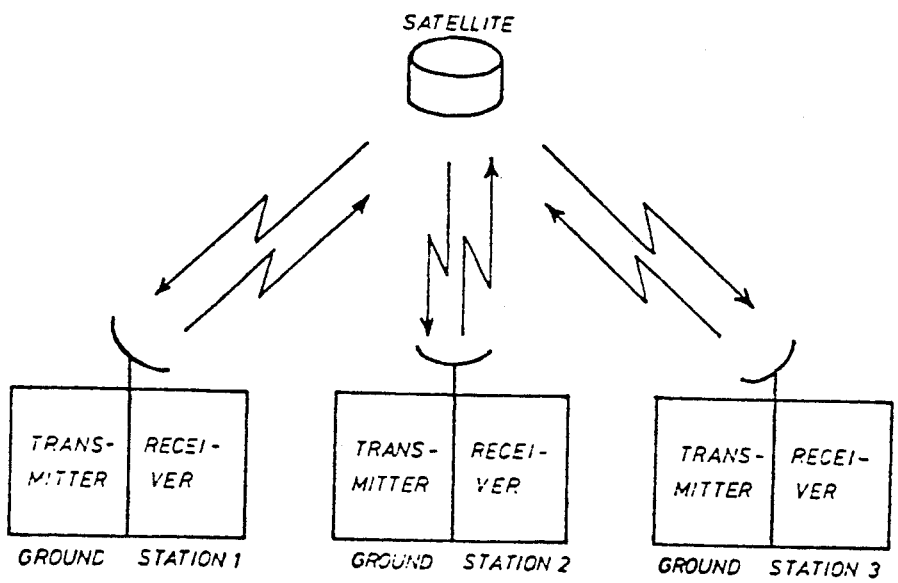
FIG. 14 shows three ground-stations with two-directional mutual communication via a satellite.

It is, of course, theoretically possible to form code words with symbols from 2 or more samples also at the so-called rate ½ method. FIG. 2 shows 6-8 PCM with coding over 2 samples. It should be observed that the code word format due to its size is shown in two parts below each other. FIG. 5 shows a calculated signal-noise ratio for some codes according to the rate ½ method with coding over 4 samples and, for comparison, also for conventional 6, 7 and 8 bit PCM. The coding gain is about 3.5 dB for 7-8 PCM and about 5 dB for 6-8 PCM with a lowest acceptable signal-noise ratio of 24 dB in the transmitted analog information. This level is not critical for 7-8 PCM. When, instead, a lowest acceptable signal-noise ratio of 30 dB is chosen, the coding gain still is about 3.5 dB.

The coding methods and code word formats heretofore described are in principle fully applicable not only to TDMA satellite communication systems, but also to time division multiplex PCM-systems where the transmission channel can comprise, for example, carrier cables or optical information communication means. An embodiment, however, which is especially designed for and adjusted to TDMA-satellite communication systems is based on the idea that a receiver station in a TDMA-system in principle can receive both the parts of a burst which are destinated to the receiver station in question, and the parts of the burst which are destinated to other receiver stations. According to said embodiment, this fact is utilized for transmitting digital symbols, for example control symbols, to a certain receiver station in parts of the burst which properly are not destinated to said receiver station. These digital symbols are formed by an adaptive encoder and, together with the digital symbols transmitted in the part of the burst destinated to said receiver station, constitute words in an error detecting and/or error correcting code. The invention, of course, implies that certain other receiver stations at the receipt and decoding of the parts of the burst destinated to them will receive and decode certain digital symbols, which have no relation to the information to be transmitted by these stations. A certain distortion in the information transmitted to these stations will arise. This distortion, however, can be held on a low level by varying intermittently or continuously the position of the control symbols in the burst. If, for example, one or some ground-stations are selected cyclically from a plurality of ground-stations, and the control symbols are transmitted in the parts of the burst associated therewith, the time mean value for the distortion in each channel can be held low. Furthermore, when information from several connections between subscribers are transmitted in a time division multiplex manner via a certain channel to a certain receiver according to a predetermined program, it is possible cyclically to select some of a plurality of connections and replace at least the least significant information symbols in words, which transmit information in the selected connections, by said control symbols. By utilizing in this way only partially a channel, i.e. only a minor portion of the time space of the channel in the burst, the time mean value for the distortion in each connection via this channel can become low. If all channels have an equal number of time division multiplex connections, the connections, i.e. the time space, in two or more channels has to be utilized in this way for transmitting the control symbols associated with the information transmitted via a channel with poor transmission properties. One way of briefly characterizing this embodiment is by stating, that the time space in the burst is redistributed from one or several channels with good transmission properties to a channel with poorer transmission properties. Another way is to state, that energy in the burst is redistributed from one or several channels with good transmission properties to a channel with poorer transmission properties. See "Redistribution of transmitted satellite power in PCM/TDMA systems by adaptive use of error-correcting codes" by Carl-Erik Sundberg and Nils Rydbeck, International Conference on Communications, ICC 75, San Francisco, California, June 1975, conference Record paper 28B, pages 28.6-28.10.

For this embodiment of the invention, a plurality of code word formats can be imagined. Lowermost in FIG. 2 two groups of 8 symbols each are shown as example. The upper left-hand group of symbols is intended to be transmitted via the channel with poor transmission properties. The information content corresponds only to 7 symbols, and the introduced redundancy to 1 symbols. For reason of simplicity, said symbols are shown as 7 pure information symbols and 1 pure control symbol, but more sophisticated distributions of the redundancy, of course, can be imagined. in analogy with previously discussed embodiments, only M of the pure information symbols are protected against errors by the error detecting or error correcting coding. The upper right-hand group and the lower groups are intended to be transmitted via the same or each via one channel with good transmission properties. Each group comprises 7 information symbols and 1 control symbol. The information symbols correspond to the information, which from a first ground-station is to be transmitted via the respective channel with good transmission properties. The control symbols, however, correspond to the information to be transmitted from the first ground-station via a channel with poor transmission properties to a second ground station. The control symbols are produced by an adaptive encoder in the first ground-station at quantization and coding of the information to be transmitted via the channel with poor transmission properties. Thus, only the control symbols together with the symbols in the upper left-hand group are comprised in the code word of the error detecting or error correcting code. The 7 information symbols in the upper right-hand and lower groups preferably constitute the 7 most significant symbols from source words with 8 symbols produced by PCM coder and multiplexor. The coding gain to be achieved with the embodiment, of course, depends on how many symbols are transmitted in parts of the burst destinated to other receivers. With 8 symbols transmitted in this way instead of 3 shown in FIG. 2, the same coding gain is obtained as at 7-8 PCM rate ½.

FIG. 6 shows an embodiment of an adaptive encoder where an error detecting 6, 4 code is used. A shift register has an input for bit synchronization signals and an input for digital binary information symbols, which arrive from the PCM coder and multiplexor in FIG. 1. The adaptive encoder further has an input for word synchronization signals and an input called coding/no coding for a signal which indicates whether error detecting coding is to take place. A 6, 4 linear block coder is coupled via logic circuits to the four first and the two last positions in the shift register. When said lastmentioned signal indicates that error detecting coding is to take place, the 6, 4 linear block coder calculates two parity bits with guidance by the symbols in the four first positions in the shift register and feeds the parity bits to the two last positions in the shift register as a replacement for the least significant symbols fed in there. This calculation and supply of the parity bits take place only when a whole source word destined via a channel with poor transmission properties is fed into the shift register. The timing and control logic keeps order on the channels via which each ingoing source word is destined and receives from the switch decision means one or several signals containing information on the transmission properties of one or several channels. The timing and control logic, therefore, can produce the signal which is fed to the input coding/no coding on the adaptive encoder. The symbols in source words or error detecting code words are fed out from the shift register at data out. The shift register, 6, 4 linear block coder and logic circuits of the type and-gate are of a kind well-known per se. A further explanation of the adaptive encoder, therefore, should not be necessary.

FIG. 7 shows an embodiment of an adpative decoder for use in a system with an adaptive decoder according to FIG. 6. Also the adaptive encoder has a shift register with inputs for bit synchronisation signals and digital information symbols received by the receivers in FIG. 1. The adaptive decoder has an input for word synchronisation signals and an input called coding/no coding for a signal with information on whether symbols fed into the shift register are coded according to an error detecting 6, 4 code or not. An error detector for the 6, 4 code is coupled via logic circuits to the first four and last two positions in the shift register and adapted to carry out a parity control only when a whole code word is fed into the shift register, and to indicate the result of the parity control at its output called error and, respectively, no error found. The adaptive decoder is constructed so that it is capable upon the detection of an error in the code word received last to feed out at its data out the symbols in the word without error received last which is associated with the same connection as said received code word with detected error. For this purpose, the adaptive decoder comprises both an old word register and a memory. The old word register includes said words without error received last for the same connection as the code word in the shift register, while the memory includes corresponding words for other connections stored to be fed out in correct order to the old word register. The output of the adaptive decoder for storing said words without error is coupled to the memory and receives symbols from an or-gate, which in its turn receives symbols either from the shift register via a first and-gate or from the old word register via a second and-gate. Said first and-gate is coupled to the output no error found on the error detector via a third and-gate, and said second and-gate is coupled to the output error found on the error detector via a fourth and-gate. The third and the fourth and-gate receive signals from the delay circuit. Responsive to the last mentioned signals and signals at the output of the error detector, the four and-gates determine whether the word in the shift register or the word in the old word memory is to be fed out from the adaptive decoder. The memory, old word memory, shift register, error detector, delay and gates are of a type conventional per se, so that an explanation in greater detail of their operation should not be necessary.

FIG. 8 shows an embodiment of an adaptive encoder where coding takes place over 2 samples, i.e. two source words. This embodiment presupposes that two source words destinated over the same channel simultaneously are available for the adaptive encoder. These two source words can be either two subsequent source words in the same connection, i.e. two source words corresponding to two subsequent samples from a source for analog information, for example speech signals from a telephone, or two source words in different connections which are transmitted via the same channel. The shift register provides space for the symbols in two source words at the same time, i.e. the positions are 16 in number. The shift register has an input, Bit Sync. for bit synchronisation signals, and an input, DATA IN, for symbols in source words. The timing and control logic controls the PCM coder and multiplexor so that the source words, which are destined over channels where error correcting coding is to be used, always are fed in pairs to the adaptive encoder. Single source words destined over such channels and surrounded by source words destined over other channels, thus, do not occur in the order of source words fed in at the data input of the shift register. When the number of connections used on such a channel is an odd number, either dummy source words can be fed to the adaptive encoder or two source words corresponding to subsequent samples of information from the same information source can be fed to said encoder. In which this is carried out is obvious for the expert and, for reasons of simplicity, memories, shift registers and logic circuits necessary for this purpose are not shown in the Figures.

Figure 9:
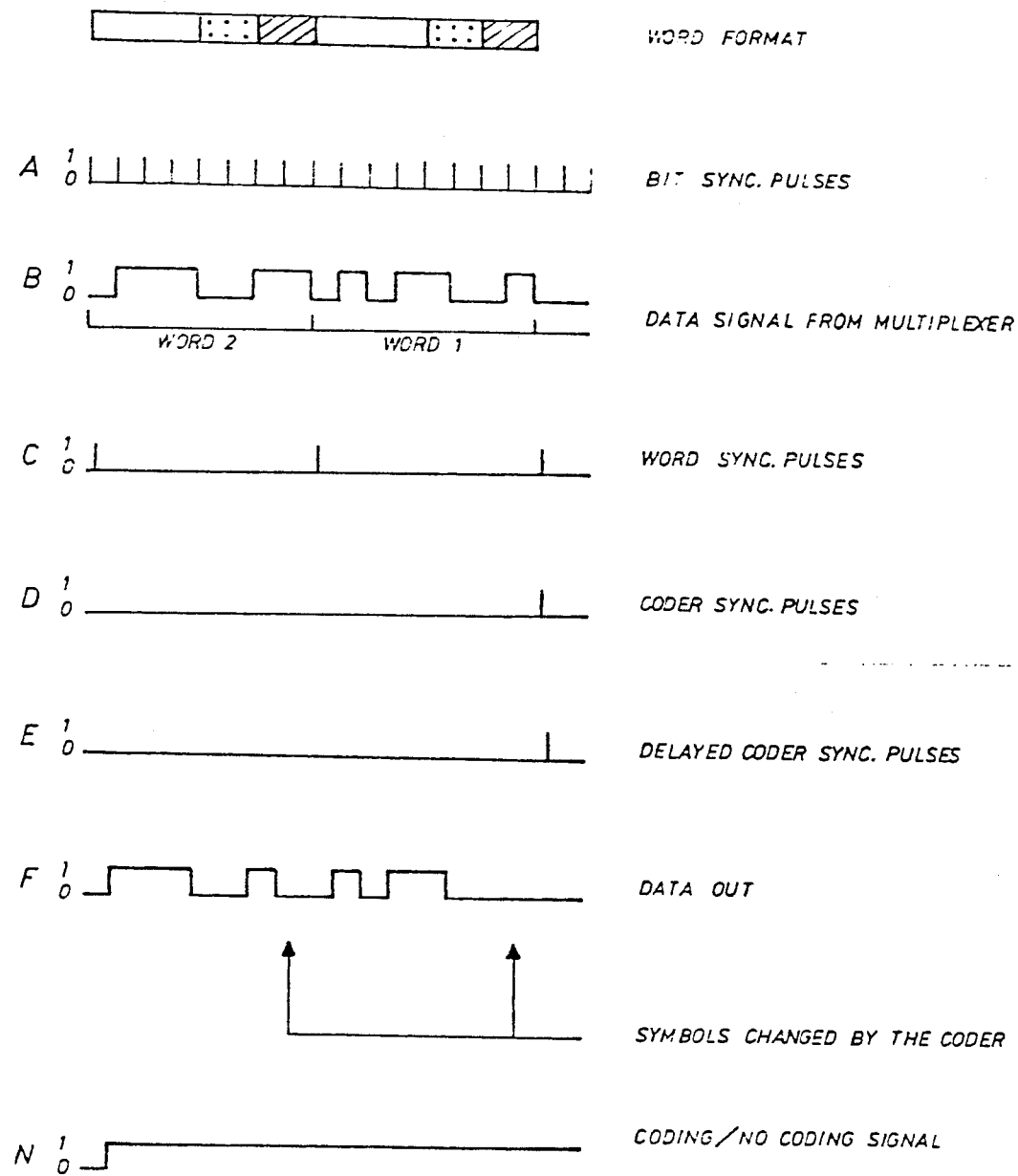
FIGS. 9 and 11 are simplified time diagrams for certain signals occurring in adaptive encoders and decoders according to FIG. 8 and, respectively FIG. 10.

A 12, 8 linear block coder is coupled via logic circuits to the positions 1-4, 7-12 and 15-16 of the shift register. For controlling the operation thereof, the adaptive encoder has inputs for word synchronisation signals and for a signal indicating whether or not error correcting coding is to take place. The adaptive encoder in FIG. 8 to a large extent operates in the same way as the encoder shown in FIG. 6. When two whole source words destined over the same channel are fed into the shift register, the linear block coder with help by the symbols in the positions 1-4 and 9-12 can calculate two groups of two symbols each and feed them to the positions 7, 8, 15 and 16 as a replacement for the symbols previously stored there. The calculation and feed are controlled by a number of logic and-circuits, the divider and a delay circuit in response to the word synchronization signals and the signal at the input CODING/NO CODING. Said lastmentioned signal is produced by the timing and control logic in response to one or more signals from the switch decision means which includes information on the transmission properties of one or more transmission channels. Error correcting coding, therefore, takes place only when the two source words in the shift register are destined over the same channel with poor transmission properties. The shift register, linear block coder, divide by two, delay and the logic and-circuits are of conventional type. In view thereof, and as FIG. 9 shows a time diagram for pulses, signals and symbols, which can be imagined to occur at A, B, C, D, E, F and N in FIG. 8, a further explanation of FIG. 8 should not be necessary.

Figure 11:
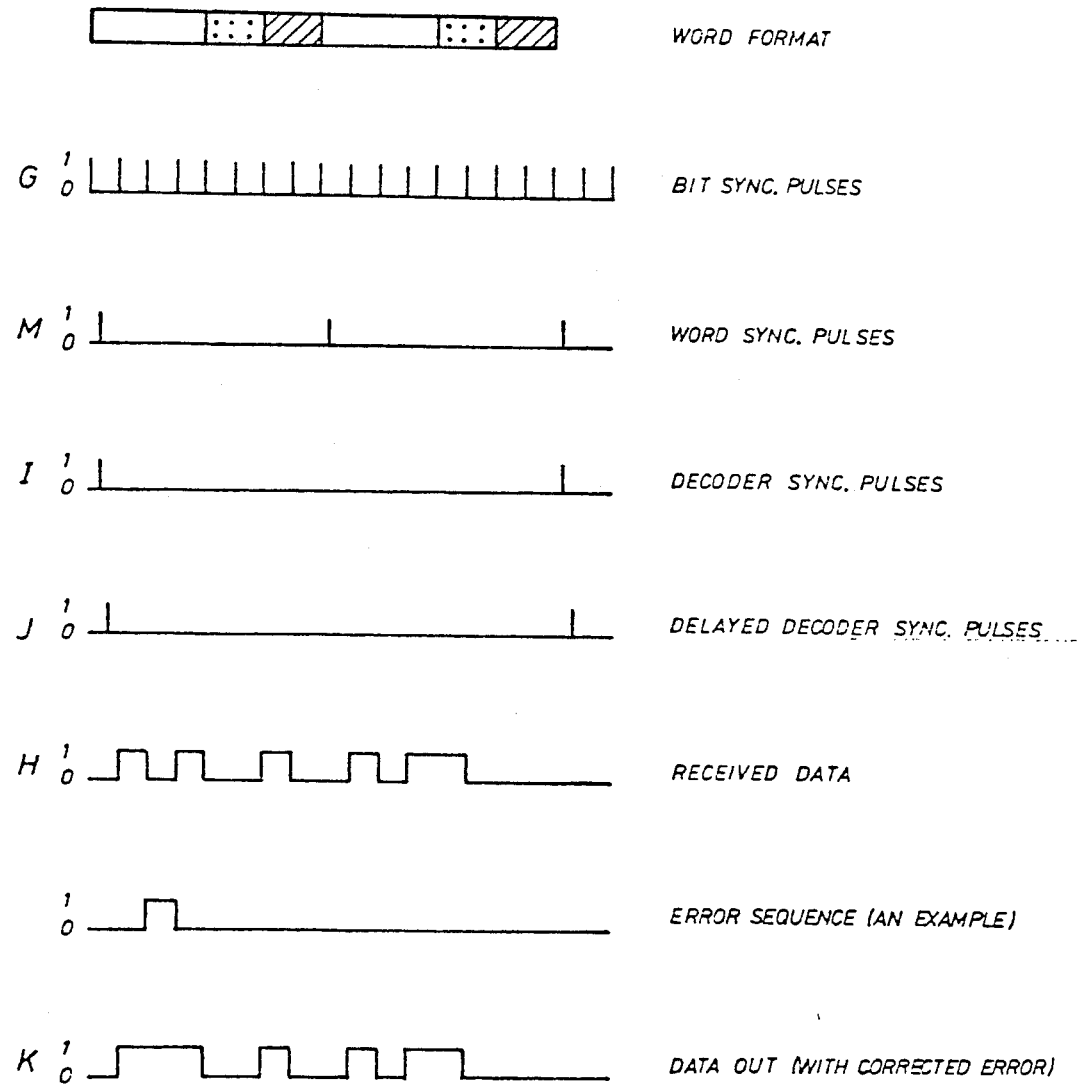

FIG. 10 shows an adaptive decoder for use in a system together with the adaptive encoder according to FIG. 8, i.e. where an error correcting 12, 8 code is used. The adaptive decoder like the adaptive encoder comprises a shift register with 16 positions, a divider circuit, a delay circuit and a number of logic and-circuits. The shift register has inputs BIT SYNC., for bit synchroniZation signals and DATA IN, for transmitted binary symbols, and an output, K, for binary symbols to be fed to PCM decoder and demultiplexor. The positions 1-4, 7-12 and 15-16 of the shift register are coupled via the logic circuits to a decoder for the 12, 8 code. The timing and control logic feeds word synchronization signals to the input WORD SYNC, of the adaptive decoder, and a signal indicating whether or not error correcting decoder is to take place to the input CODING/NO CODING. The error correcting decoding, which takes place only when a whole code word is found in the shift register, is carried out by a decoder for the 12, 8 code. Since the shift register, decoder for the 12, 8 code, divide by two, delay and logic circuits are of conventional type, and FIG. 11 shows a time diagram for an example of occuring pulses, signals and symbols in FIG. 10, which example corresponds to that shown in FIG. 9, FIG. 10 should not require any further description.

Figure 12:
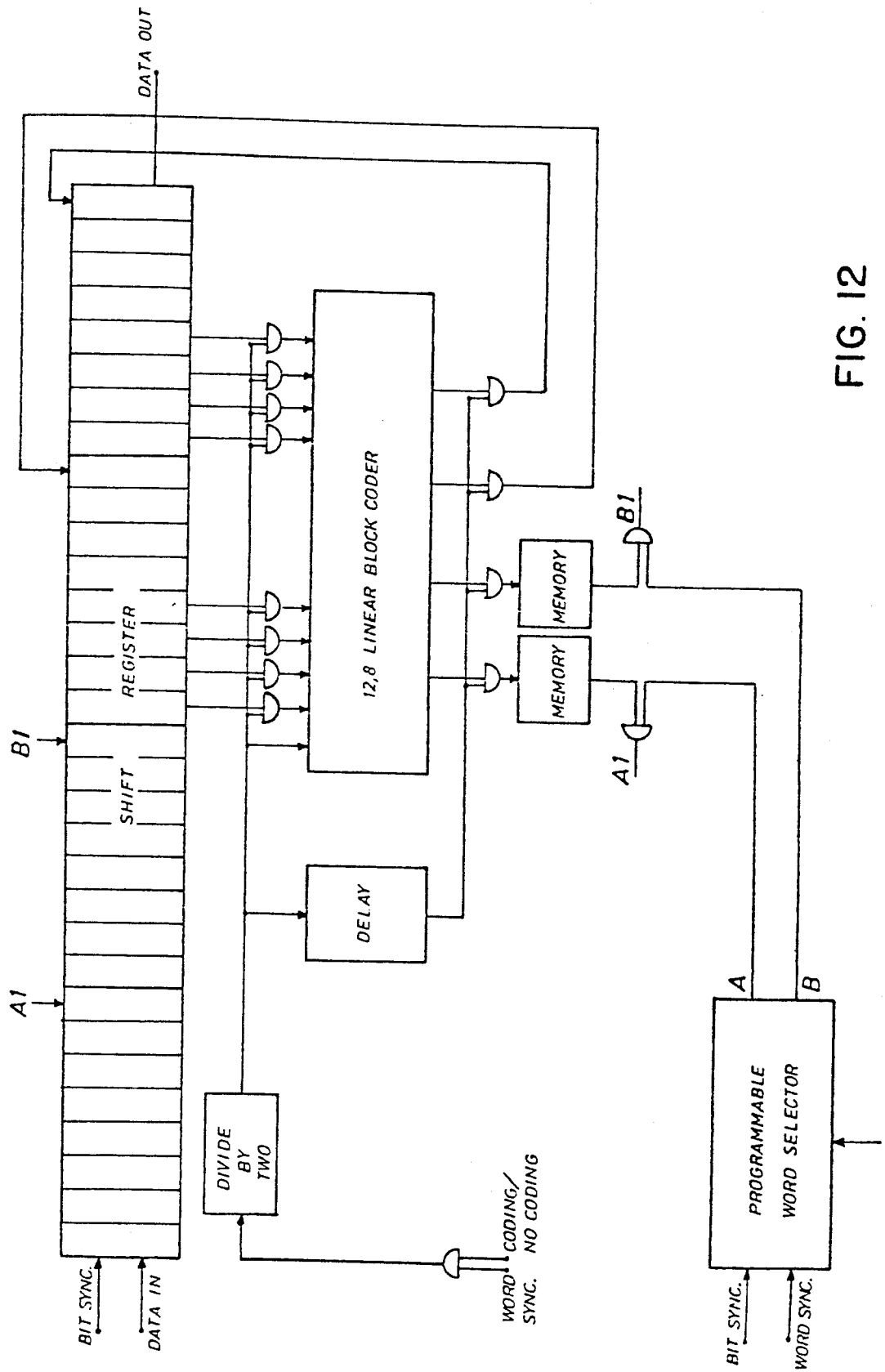
FIGS. 12 and 13 show the structure of adaptive encoders and decoders in FIG. 1 according to a further embodiment of the invention.
Figure 13:
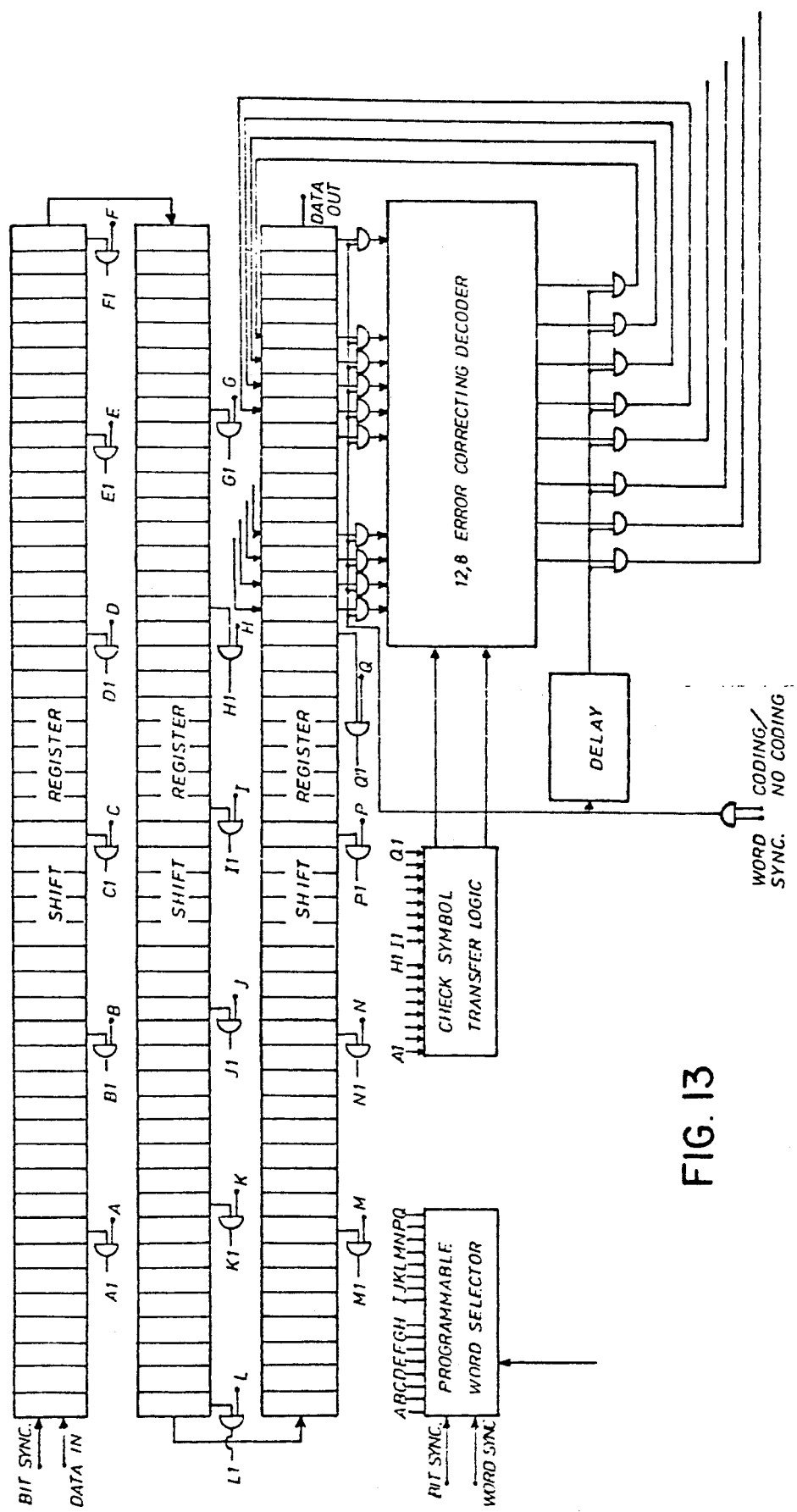

FIG. 12 shows an example of parts of an adaptive encoder, and FIG. 13 shows corresponding parts of an adaptive decoder for use in a TDMA-system where control bits for words destined over a channel with poor transmission properties partly are transmitted in words destinated over channels with better transmission properties. The adaptive encoder and decoder operate substantially in the same way as those shown in FIGS. 8 and 10, except for the essential difference that a number of symbols in the code words are transmitted instead of the last symbol in source words destinated over other channels. The adaptive encoder, therefore, has two memories where symbols in the code word produced by the linear block coder are stored waiting for said last mentioned source words to be correctly positioned in the shift register. The adaptive encoder has a programmable word selector, which cyclically selects two words in the burst and via the out-signals A and B manages the replacement of the least significant symbols in these words by the symbols stored in the memory. For this purpose, the programmable word selector has inputs for bit synchronization signals, word synchronization signals and signals from the timing and control logic in FIG. 1. For reason of simplicity, the lines are not shown, which connect the logic circuits with the out-signals A1 and B1 and the positions in the shift register where A1 and B1 are fed in at the right moment. The blocks, divide by two and delay, as well as the shift register and linear block coder operate substantially in the same way as in FIG. 10. The adaptive encoder, therefore, like the one in FIG. 10 has inputs for bit synchronization signals, data, i.e. binary digital symbols, word synchronization signals and an input coding-/no coding for a signal from the timing and control logic which indicates whether or not error correcting coding according to the 12, 8 is to take place.

The adaptive decoder shown in FIG. 13 has a shift register with as many positions as required for all digital symbols in the words in the burst. The shift register has an input, bit sync., for bit synchronization signals and an input, data in, for received binary digital symbols, and an output, data out, for possibly corrected digital binary symbols. The shift register due to its length is shown in the Figure divided into three parts. Each eighth position in each part is coupled to a logic circuit, to which besides is fed one of the signals A to Q from the programmable word selector. The last mentioned said block is programmed so that it selects cyclically, according to a predetermined program, the two words in the burst, in which control symbols included in the error correcting 12, 8 code have been transmitted from the transmitter in FIG. 1. For this purpose, the programmable word selector has inputs for bit synchronization signals, word synchronization signals and signals from the timing and control logic in FIG. 1. An error correcting decoder for the 12, 8 code is coupled via logic circuits to 10 of the last 16 positions in the shift register. The adaptive decoder further comprises a check symbol transfer logic, to which are fed signals A1 . . . Q1 from the logic circuits coupled to each eighth position in the shift register and a number of signals from the programmable word selector. The check symbol transfer logic in response to signals received can forward one of the signals A1 . . . Q1 at one output and another of said signals A1 . . . Q1 at its other output to the error correcting decoder for the 12, 8 code. The adaptive decoder, finally, has an input, WORD SYNC., for word synchronization signals and an input, coding-/no coding, for a signal from the timing and control logic in FIG. 1, which signal indicates whether or not the two words found in the last 16 positions in the shift register are coded according to the error correcting 12, 8 code on the transmitter side. The two control symbols, which were transmitted in two other words in the burst, are found on two of A1 ... Q1 and are selected by the programmable word selector and transmitted to the error correcting decoder via the check symbol transfer logic. The lines A—A ... Q—Q and A1—A1 ... Q1—Q1 between the programmable word selector and shift register and, respectively, between the shift register and the check symbol transfer logic are not shown, for reason of simplicity. The remaining digital symbols included in the code word in the error correcting code are found at the right moment at the outputs from the 10 logic circuits coupled to 10 of the 16 last positions in the shift register. The error correcting decoder with guidance by the total of the 12 binary symbols calculates 8 error corrected binary digital symbols, which via logic circuits are fed to 8 of the 16 last positions in the shift register. The symbols corrected against errors can thereafter be fed out from the shift register at the output data out. The remaining words in the shift register can be fed in a conventional manner to the PCM decoder and demultiplexor in FIG. 1 only to the extent as they are carrying information associated with some of the subscribers connected to the PCM decoder and demultiplexor. As the shift register and error correcting decoder and delay as well as the logic circuits are of conventional type, and as the remaining blocks can be constructed by the expert, a further description of FIG. 13 does not seem to be necessary. For reason of completeness, however, it is mentioned that the error correcting decoder co-operates with the shift register in about the same way as the corresponding blocks co-operate in FIG. 10.

The embodiments described above refer primarily to TDMA-systems and to some extent to other PCM-system. The invention, however, is applicable to digital modulation methods other than PCM. Instead of PCM, for example, delta modulations, DM, or differential pulse code modulation, DPCM, can be applied. Furthermore, other relations between analog information and digital symbols in the modulation method than the described 6, 4 and 12, 8 codes can be used. At embodiments where the least significant symbols in a source word are to be replaced by symbols in the code word, of course, the symbols in the source word must have a different significance, for example according to a natural binary code.

The embodiments described, further, are related to systems where each channel has been used for time division multiplex transmission of information from several connections, for example telephone conversations. The invention, however, can be applied also to systems where one or more channels transmit information from only one connection, for example a television connection.

Instead of binary digital symbols in source words and code words, it is possible in principle, for example, to use ternary digital symbols. Furthermore, the number of digital symbols in a source word, of course, need not be 8, but may be either greater or smaller, depending on the type of analog information to be transmitted or on the coders producing the source words.

Further modifications of the embodiments can be imagined within the scope of the claims. Error correcting coding, for example, can be applied simultaneously on two or more channels.

We claim:

1. An improved method for adapting transmission of analog information by digital modulation methods over a channel to variations in the transmission properties of the channel, the method including the steps of:
    producing at least one control signal containing information indicative of the transmission properties of the channel;
    using a first source code without introduced redundancy in the digital symbols thereof and with a first number of quantization levels in response to a said control signal for transmission of the information over the channel when the transmission properties are good; and
    switching over to a second source code protected by an error-protecting code with introduced redundancy in the digital symbols thereof for transmission of the information over the said channel in response to said control signal when the transmission properties are poorer;
    wherein said second source code has a number of quantization levels sufficiently smaller than that of the first source code such that the transmission speed is maintained after switching over from said first to said second source codes in spite of the introduced redundancy in the digital symbols transmitted over the said channel.

2. A method for adapting transmission of analog information by digital modulation methods over a channel to variations in the transmission properties of the channel comprising the steps of:
    coding the analog information to be transmitted according to a source code;
    producing at least one control signal containing information indicative of the transmission properties of the channel;
    in response to said control signal using a first code without introduced redundancy in the digital symbols and with a first number of quantization levels for transmission of the analog information over the channel when the transmission properties of the channel are good;
    switching over to an error-protecting code with introduced redundancy in the digital symbols for transmission of the analog information over the channel in response to said control signal when the transmission properties of the channel are poorer; and
    using an error-protecting code having a number of quantization levels sufficiently smaller than the first number such that the transmission speed for analog information over the channel is maintained after switching over to said error-protecting code in spite of the redundancy introduced thereby in the digital symbols transmitted over the channel.

3. An improved method for adapting transmission of analog information by digital modulation methods over a channel to variation in the transmission properties of the channel, the method including the steps of:
    producing at least one control signal containing information indicative of the transmission properties of the channel;
    using a first source code without introduced redundancy in the digital symbols thereof for transmission of the information over the channel in response to said control signal when the transmission properties of the channel are good;

switching over to a second source code protected by an error-protecting code with introduced redundancy in the digital symbols thereof for transmission of the information over the channel in response to said control signal when the transmission properties of the channel are poorer;

wherein said method further includes obtaining the second source code by deleting certain symbols in the first source code thus obtaining space for the digital symbols in the error-protecting code, whereby the possible transmission speed over the channel is maintained after switching over to said second code in spite of the resulting introduced redundancy in the digital symbols transmitted over the channel.

4. A method according to claim 3 wherein:
the first source code is of the 8 bit PCM type;
only the least significant bits in each PCM-word are deleted and replaced; and
not more than two bits in each PCM-word are deleted and replaced.

5. A method according to claim 3 wherein:
the error-protecting code is formed of digital symbols from more than one PCM-word.

6. A method according to claim 13 wherein:
the error-protecting code is of a type protecting only errors in the most significant digital symbols.

7. A method for adapting the transmission of analog information by means of a TDMA satellite communication system to the varying transmission properties of a first channel from a first earth station to a second earth station, comprising the steps of:

producing at least one control signal containing information indicative of the transmission properties of the first channel;

using a first source code without introduced redundancy in the digital symbols thereof and with a first number of quantization levels for transmitting information destinated over the first channel and for transmitting information destinated over at least one additional channel from the first earth station to at least one additional earth station in response to said control signal when the transmission properties of the first channel are good;

switching over to a second source code protected by an error-protecting code with introduced redundancy in the digital symbols thereof and with a second number of quantization levels for transmitting information destinated over the first channel in response to said control signal when the transmission properties of the first channel are poorer;

switching over to a third source code without redundancy in the digital symbols thereof and with a third number of quantization levels for transmitting at least part of the information destinated over said at least one additional channel in response to said control signal when the transmission properties of the first channel are poorer; and wherein said second and third source codes protected by an error-protecting code are respectively provided with quantization levels sufficiently smaller than those in said first source code such that the possible transmission speed of the system is maintained after switching over to said second and third code in spite of the introduced redundancy in the digital symbols transmitted.

8. A method for adapting the transmission of analog information by means of a TDMA satellite communication system to the varying transmission properties of a first channel from a first earth station to a second earth station, comprising the steps of:

producing at least one control signal containing information indicative of the transmission properties of the first channel;

using a first source code without introduced redundancy in the digital symbols thereof for transmitting information destinated over the first channel and at least one additional channel from the first earth station to at least one additional earth station in response to said control signal when the transmission properties of the first channel are good;

using a second source code protected by an error-protecting code with introduced redundancy in the digital symbols thereof for transmitting information destinated over the first channel in response to said control signal when the transmission properties of the first channel are poorer;

switching over to a third source code without introduced redundancy in the digital symbols for transmitting at least part of the information destinated over said at least one additional channel in response to said control signal when the transmission properties of the first channel are poorer; and wherein said method further includes obtaining the second and the third source codes by deleting at least certain of the digital symbols in the first source code and replacing the deleted symbols by an equal number of digital symbols in the error-protecting code.

9. A method according to claim 8 wherein the third source code is used on part of at least two additional channels and these parts being cyclically selected among the digital symbols used for transmitting information not destined over the first channel.

10. A method according to claim 9 wherein:
the first code is of the 8 bit PCM type;
only the least significant bits in PCM words destined over the first and additional channels are replaced by digital symbols in the error-protecting code; and
not more than two bits in each PCM word destined over the first channel and one bit in each PCM word destined over the additional channels are replaced.

* * * * *